(12) United States Patent
Wang et al.

(10) Patent No.: US 6,362,087 B1
(45) Date of Patent: Mar. 26, 2002

(54) METHOD FOR FABRICATING A MICROELECTRONIC FABRICATION HAVING FORMED THEREIN A REDISTRIBUTION STRUCTURE

(75) Inventors: Tsing-Chow Wang, Cupertino; Te-Sung Wu, San Jose; Erh-Kong Chieh, Cupertino, all of CA (US)

(73) Assignee: Aptos Corporation, Milpitas, CA (US)

( * ) Notice: Subject to any disclaimer, the term of this patent is extended or adjusted under 35 U.S.C. 154(b) by 0 days.

(21) Appl. No.: 09/565,541

(22) Filed: May 5, 2000

(51) Int. Cl.$^7$ ............................ H01L 21/44; H01L 23/02
(52) U.S. Cl. .................... 438/597; 438/107; 438/109; 438/111; 438/612; 438/614; 257/685; 257/700; 257/723; 257/773; 257/783
(58) Field of Search ................. 438/597, 107, 438/108, 109, 111, 112, 612, 614; 257/685, 700, 723, 783, 773

(56) References Cited

U.S. PATENT DOCUMENTS

| 5,455,387 A | | 10/1995 | Hoffman et al. |
| 5,554,940 A | * | 9/1996 | Hubacher ................... 324/765 |
| 5,767,010 A | * | 6/1998 | Mis et al. ................... 438/614 |
| 5,892,179 A | * | 4/1999 | Rinne et al. ................ 174/261 |
| 5,902,686 A | * | 5/1999 | Mis ............................ 428/629 |
| 5,946,552 A | | 8/1999 | Bird et al. |
| 6,230,400 B1 | * | 5/2001 | Tzanavaras et al. .......... 29/840 |

* cited by examiner

Primary Examiner—Matthew Smith
Assistant Examiner—Igwe U. Anya
(74) Attorney, Agent, or Firm—Tung & Associates

(57) ABSTRACT

Within a method for fabricating a microelectronic fabrication there is first provided a substrate. There is then formed over the substrate a patterned bond pad layer. There is also formed over the substrate and in electrical communication with the patterned bond pad layer a patterned redistribution layer, wherein the patterned redistribution layer is formed employing a plating method. The method is particularly economical for fabricating the microelectronic fabrication.

15 Claims, 1 Drawing Sheet

METHOD FOR FABRICATING A MICROELECTRONIC FABRICATION HAVING FORMED THEREIN A REDISTRIBUTION STRUCTURE

CROSS-REFERENCE TO RELATED APPLICATIONS

This application is related to: (1) co-assigned application Ser. No. 09/564,589, titled "Microelectronic Fabrication Having Formed Therein Terminal Electrode Structure Providing Enhanced Barrier Properties"; and (2) co-assigned application Ser. No. 09/565,962, titled "Microelectronic Fabrication Having Formed Therein Terminal Electrode Structure Providing Enhanced Passivation and Enhanced Bondability," each of which related co-assigned applications is filed on an even date herewith and the teachings of each of which related co-assigned applications is incorporated herein by reference.

BACKGROUND OF THE INVENTION

1. Field of the Invention

The present invention relates generally to microelectronic fabrications having formed therein redistribution structures. More particularly, the present invention relates to methods for fabricating microelectronic fabrications having formed therein redistribution structures.

2. Description of the Related Art

Microelectronic fabrications are formed from microelectronic substrates over which are formed patterned microelectronic conductor layers which are separated by microelectronic dielectric layers.

In conjunction with various means and configurations for interconnecting microelectronic fabrications of various varieties, it is common in the art of microelectronic fabrication to employ integral to individual microelectronic fabrications terminal electrode structures at locations within the individual microelectronic fabrications where the individual microelectronic fabrications are to be interconnected. Such terminal electrode structures are typically formed integral to the individual microelectronic fabrications while employing various metallurgy layers, which under certain circumstances may include solder interconnection layers, to which the various means and configurations for interconnecting the microelectronic fabrications may be connected. Similarly, and in conjunction with terminal electrode structures within microelectronic fabrications, there is also often employed within microelectronic fabrications redistribution structures which provide for a geometric redistribution of electrical connection structures, such as terminal electrode structures, within microelectronic fabrications.

While terminal electrode structures are thus desirable and clearly essential within the art of microelectronic fabrication for effectively providing electrical interconnections for various varieties of microelectronic fabrications which may be fabricated within the art of microelectronic fabrication, and similarly redistribution structures often provide unique and significant advantages in the art of microelectronic fabrication when fabricating microelectronic fabrications, both terminal electrode structures and redistribution structures are nonetheless not entirely without problems in the art of microelectronic fabrication when fabricating microelectronic fabrications. In that regard, it is typically highly desirable within the art of microelectronic fabrication, but nonetheless not always readily achievable within the art of microelectronic fabrication, to provide within a microelectronic fabrication a terminal electrode structure, and in particular a redistribution structure, both of which are economically fabricated with optimal properties.

It is thus towards the goal of providing for use when fabricating a microelectronic fabrication a terminal electrode structure, and in particular a redistribution structure, economically fabricated with optimal properties that the present invention is directed.

Various configurations and materials have been disclosed within the art of microelectronic fabrication for fabricating, with desirable properties, various microelectronic fabrication structures within microelectronic fabrications for use within the art of microelectronic fabrication.

For example, Hoffman et al., in U.S. Pat. No. 5,455,387, discloses a semiconductor integrated circuit microelectronic fabrication packaging microelectronic fabrication wherein there may be employed within the semiconductor integrated circuit microelectronic fabrication packaging microelectronic fabrication a single sized lead frame while simultaneously employing within the semiconductor integrated circuit microelectronic fabrication packaging microelectronic fabrication different sized semiconductor integrated circuit microelectronic fabrication die. To realize the foregoing result, the semiconductor integrated circuit microelectronic fabrication packaging microelectronic fabrication employs interposed between a lead frame and a semiconductor integrated circuit microelectronic fabrication die a redistribution interposer structure intended to accommodate semiconductor integrated circuit microelectronic fabrication die of various sizes.

In addition, Hubacher, in U.S. Pat. No. 5,554,940, discloses a semiconductor integrated circuit microelectronic fabrication and a method for fabricating the semiconductor integrated circuit microelectronic fabrication, wherein the semiconductor integrated circuit microelectronic fabrication may be readily tested with a single probe card assembly independent of whether the semiconductor integrated circuit microelectronic fabrication is subsequently wire bonded, tape automated bonded or solder bump bonded. To realize the foregoing result, the semiconductor integrated circuit microelectronic fabrication employs when fabricating the semiconductor integrated circuit microelectronic fabrication and formed over a patterned bond pad layer within the semiconductor integrated circuit microelectronic fabrication a redistribution structure comprising: (1) a test pad layer at a location proximal to the patterned bond pad layer; and (2) a solder bump pad layer at a location removed from the test pad layer, wherein the test pad layer, the solder bump pad layer and the bond pad layer are all in electrical communication.

Finally, Bird et al., in U.S. Pat. No. 5,946,552, discloses a semiconductor integrated circuit microelectronic fabrication packaging substrate and a method for fabricating the semiconductor integrated circuit microelectronic fabrication packaging substrate, wherein the semiconductor integrated circuit microelectronic fabrication packaging substrate may be employed for packaging various similarly sized semiconductor integrated circuit microelectronic fabrication die which have otherwise distinct wiring requirements. To realize the foregoing result, the semiconductor integrated circuit microelectronic fabrication packaging substrate comprises: (1) a first layer which has formed thereupon a minimum of two series of bond pad layers which correspond with separate wire-out requirements of at least two semiconductor integrated circuit microelectronic fabrication die which may be further fabricated while employing the semiconductor integrated circuit microelectronic fabrication packaging substrate; and (2) a second layer connected to the first layer through a series of vias corresponding with the at least two series of bond pad layers, where the second layer comprises a redistribution structure which redistributes from the minimum of two series of bond pad layers electrical signals to a set of connector pins within the semiconductor integrated circuit microelectronic fabrication packaging substrate.

Desirable for use when fabricating microelectronic fabrications are additional methods and materials which may be employed for fabricating within microelectronic fabrications terminal electrode structures, and in particular redistribution structures, which are economically fabricated with optimal properties.

It is towards the foregoing objects that the present invention is directed.

SUMMARY OF THE INVENTION

A first object of the present invention is to provide a method for fabricating a redistribution structure for use within a microelectronic fabrication.

A second object of the present invention is to provide a method for fabricating a redistribution structure in accord with the first object of the present invention, wherein the redistribution structure is economically fabricated with optimal properties.

A third object of the present invention is to provide a method for fabricating a redistribution structure in accord with the first object of the present invention and the second object of the present invention, which method is readily commercially implemented.

In accord with the objects of the present invention, there is provided by the present invention a method for fabricating a redistribution structure for use when fabricating a microelectronic fabrication. To practice the method of the present invention, there is first provided a substrate. There is then formed over the substrate a patterned bond pad layer. There is also formed over the substrate and in electrical communication with the patterned bond pad layer a patterned redistribution layer, wherein the patterned redistribution layer is formed employing a plating method.

The present invention provides a method for fabricating a redistribution structure for use within a microelectronic fabrication, wherein the redistribution structure is economically fabricated with optimal properties. The present invention realizes the foregoing object by employing a plating method when fabricating a patterned redistribution structure for use within a microelectronic fabrication in accord with the present invention.

The method of the present invention is readily commercially implemented. As is illustrated within the Description of the Preferred Embodiment which follows, the present invention employs methods and materials as are otherwise generally known in the art of microelectronic fabrication, but employed within the context of specific process controls, process limitations and process sequencing to provide the present invention. Since it is thus a materials selection and process control which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating a redistribution structure for use when fabricating a microelectronic fabrication, where the redistribution structure is economically fabricated with optimal properties. The present invention realizes the foregoing objects by employing when fabricating the redistribution structure a plating method.

Although the present invention provides particular value when fabricating a redistribution structure for use when fabricating a semiconductor integrated circuit microelectronic fabrication, the present invention may also be employed for fabricating redistribution structures for use when fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
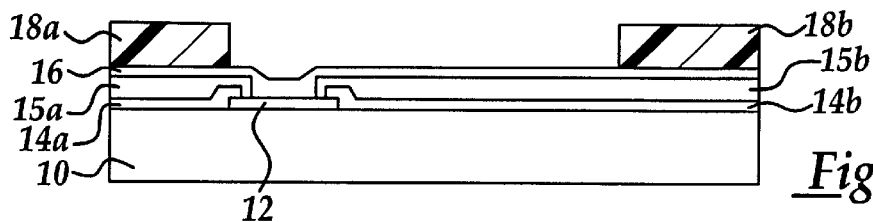
FIG. 1, FIG. 2, FIG. 3, FIG. 4 and FIG. 5 show a series of schematic cross-sectional diagrams illustrating the results of progressive stages in fabricating, in accord with a preferred embodiment of the present invention, a microelectronic fabrication having fabricated therein a terminal electrode structure and a redistribution structure in accord with the present invention.

Referring now to FIG. 1 to FIG. 5, there is shown a series of schematic cross-sectional diagrams illustrating the results of fabricating, in accord with a preferred embodiment of the present invention, a microelectronic fabrication having fabricated therein a terminal electrode structure and a redistribution structure in accord with the present invention. Shown in FIG. 1 is a schematic cross-sectional of the microelectronic fabrication at an early stage in its fabrication in accord with the preferred embodiment of the present invention.

Shown in FIG. 1, in a first instance, is a substrate 10 having formed thereover a patterned bond pad layer 12.

Within the preferred embodiment of the present invention with respect to the substrate 10, and although, as noted above, the present invention provides particular value when employed in fabricating a redistribution structure within a semiconductor integrated circuit microelectronic fabrication, the substrate 10 may be employed when fabricating a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, although not specifically illustrated within the schematic cross-sectional diagram of FIG. 1, the substrate 10 may consist of a substrate alone as employed within the microelectronic fabrication within which is employed the substrate 10, or in the alternative, the substrate 10 may comprise the substrate as employed within the microelectronic fabrication within which is employed the substrate 10, where the substrate has formed thereupon and/or thereover any of several additional microelectronic layers as are conventionally employed within the microelectronic fabrication within which is employed the substrate 10. Similarly with the substrate alone as employed within the microelectronic fabrication, such additional microelectronic layers may be formed of microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 1, the substrate 10, typically and preferably, although not exclusively, when the substrate 10 comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to, resistors, transistors, diodes and capacitors.

Most typically and preferably, within the preferred embodiment of the present invention, the substrate 10 comprises a semiconductor substrate having formed therein and/or thereupon various microelectronic devices, wherein the semiconductor substrate also has formed thereupon and/or thereover several microelectronic layers which include but are not limited to the patterned bond pad layer 12.

Within the preferred embodiment of the present invention with respect to the patterned bond pad layer 12, the patterned bond pad layer 12 may be formed of bond pad materials as are conventional within the microelectronic fabrication within which is employed the patterned bond pad layer 12, such bond pad materials being selected from the group including but not limited to aluminum, aluminum alloy, copper and copper alloy bond pad materials. Typically and preferably, the patterned bond pad layer 12 may be formed from any of the foregoing bond pad materials, formed to a thickness of from about 6000 to about 12000 angstroms while being patterned to form the patterned bond pad layer 12 of bidirectional linewidth from about 40 to about 120 microns.

Shown also within the schematic cross-sectional diagram of FIG. 1, and also formed over the substrate 10 and passivating a pair of edges of the patterned bond pad layer 12 is a pair of patterned first conformal dielectric layers 14a and 14b, where each of the pair of patterned first conformal dielectric layers 14a and 14b has formed thereupon and further passivating the pair of edges of the patterned bond pad layer 12 a pair of patterned first planarizing dielectric layers 15a and 15b. While the schematic cross-sectional diagram of FIG. 1 illustrates the pair of patterned first conformal dielectric layers 14a and 14b and the pair of patterned first planarizing dielectric layers 15a and 15b incident to a cross-section through the microelectronic fabrication as illustrated within the schematic diagram of FIG. 1, it is nonetheless understood by a person skilled in the art that the pair of patterned first conformal dielectric layers 14a and 14b and the pair of patterned first planarizing dielectric layers 15a and 15b is intended as illustrative of portions of a single patterned first conformal dielectric layer and a single patterned first planarizing dielectric layer which uniformly passivate all of the edges of the patterned bond pad layer 12 while leaving exposed a central portion of the patterned bond pad layer 12.

Within the preferred embodiment of the present invention, the pair of patterned first conformal dielectric layers 14a and 14b and the pair of patterned first planarizing dielectric layers 15a and 15b may be formed of passivation dielectric materials as are conventional in the art of microelectronic fabrication, such passivation dielectric materials being selected from the group including but not limited to silicon oxide passivation dielectric materials, silicon nitride passivation dielectric materials, silicon oxynitride passivation dielectric materials, laminates thereof and composites thereof. Typically and preferably, at least one of the pair of patterned first conformal dielectric layers 14a and 14b and the pair of patterned first planarizing dielectric layers 15a and 15b is formed at least in part of a silicon nitride passivation dielectric material, wherein each of the pair of patterned first conformal dielectric layers 14a and 14b is typically and preferably formed to a thickness of from about 8000 to about 12000 angstroms and each of the pair of patterned first planarizing dielectric layers 15a and 15b is typically and preferably formed to a thickness of from about 3 to about 6 microns, passivating the pair of opposite edges of the patterned bond pad layer 12 while leaving exposed the central portion of the patterned bond pad layer 12. Typically and preferably, each of the pair of patterned first conformal dielectric layers 14a and 14b overlaps the patterned bond pad layer 12 by a distance of from about 6 to about 16 microns, and each of the pair of patterned first planarizing dielectric layers 15a and 15b overlaps the patterned bond pad layer by a distance of up to about 22 microns, in order to provide optimal passivation of the edges of the patterned bond pad layer 12 while leaving exposed the central portion of the patterned bond pad layer 12.

Shown also within the schematic cross-sectional diagram of FIG. 1 is a blanket barrier layer 16 formed upon the pair of patterned first planarizing dielectric layers 15a and 15b and extending over and upon the exposed central portion of the patterned bond pad layer 12.

Within the preferred embodiment of the present invention with respect to the blanket barrier layer 16, the blanket barrier layer 16 is typically and preferably formed of a barrier material which provides for inhibited interdiffusion of each of: (1) the bond pad material from which is formed the patterned bond pad layer 12; and (2) the passivation dielectric material from which is formed the pair of patterned first planarizing dielectric layers 15a and 15b; with (3) a conductor material which is employed for forming a patterned redistribution layer which is subsequently formed contacting the blanket barrier layer 16.

Although such barrier materials may include but are not limited to various refractory metal barrier materials (i.e., titanium, tungsten, and molybdenum refractory metal barrier materials) and alloys thereof, for the preferred embodiment of the present invention the blanket barrier layer 16 is typically and preferably formed of either: (1) a single layer of a refractory metal barrier material, such as a titanium or a tungsten refractory metal barrier material having a thickness of from about 900 to about 1100 angstroms; or (2) a stack of layers comprising: (a) a blanket first titanium-tungsten alloy barrier material layer of thickness about 450 to about 550 angstroms, having formed thereupon; (b) a blanket titanium-tungsten alloy nitride barrier material layer of thickness about 2700 to about 3300 angstroms, in turn having formed thereupon; (c) a blanket second titanium-tungsten alloy barrier material layer of thickness about 900 to about 1100 angstroms. Each of the foregoing two options of materials for the blanket barrier layer 16 may be formed employing methods as are conventional in the art of microelectronic fabrication, including but not limited to chemical vapor deposition (CVD) methods, thermally assisted evaporation methods and physical vapor deposition (PVD) sputtering methods. With respect to the later tri-layer stack of barrier materials for forming the blanket barrier layer 16, such is described in greater detail within the related co-assigned application Ser. No. 09/5645,598, attorney docket number APTOS 99-002, filed on an even date herewith, and titled "Microelectronic Fabrication Having Formed Therein Terminal Electrode Structure Providing Enhanced Barrier Properties," the teachings of which are incorporated herein fully by reference.

Similarly, although not specifically illustrated within the schematic cross-sectional diagram of FIG. 1, within the context of the preferred embodiment of the present invention the blanket barrier layer 16 typically and preferably also has formed thereupon a blanket seed layer, typically and preferably, but not exclusively formed of a metal seed material of composition consistent with a conductor material which is employed when forming the patterned redistribution layer upon the blanket barrier layer 16. Typically and preferably, the blanket seed layer is formed of a copper or copper alloy metal seed material, when the patterned redistribution layer is formed of a copper or copper alloy conductor material, although the blanket seed layer may also be formed of other conductor materials, such as but not limited to gold and gold alloy conductor materials. Typically and preferably, the blanket seed layer is formed to a thickness of from about 3600 to about 4400 angstroms, wherein the blanket seed layer provides for enhanced plating characteristics with respect to an electroplating method employed in further fabrication of the patterned redistribution layer within the microelectronic fabrication whose schematic cross-sectional diagram is illustrated in FIG. 1.

Finally, there is also shown within the schematic cross-sectional diagram of FIG. 1 a pair of patterned first photoresist layers 18a and 18b formed over the blanket barrier layer 16 which within the context of the preferred embodiment of the present invention has formed thereupon the blanket seed layer which is not specifically illustrated within the schematic cross-sectional diagram of FIG. 1.

Within the preferred embodiment of the present invention with respect to the pair of patterned first photoresist layers 18a and 18b, the pair of patterned first photoresist layers 18a and 18b may be formed employing methods and photoresist materials as are conventional in the art of microelectronic fabrication, such photoresist materials being selected from the general groups of photoresist materials including but not limited to positive photoresist materials and negative photoresist materials. Typically and preferably, each of the pair of patterned first photoresist layers 18a and 18b is formed to a thickness of from about 10 to about 20 microns to define a first aperture of having a longer dimension from about 50 to about 6000 microns and a narrower dimension from about 10 to about 100 microns, into which first aperture is subsequently formed employing a plating method in accord with the preferred embodiment of the present invention the patterned redistribution layer.

Figure 2:
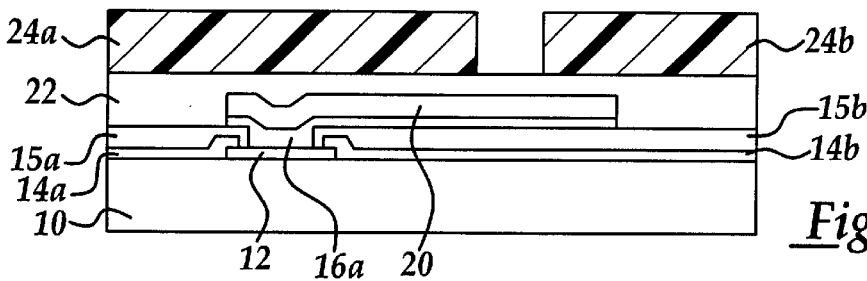

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein, in part: (1) there has been formed within the first aperture defined by the pair of patterned first photoresist layers 18a and 18b a patterned redistribution layer 20; (2) the pair of patterned first photoresist layers 18a and 18b has then been stripped from the microelectronic fabrication; and (3) the blanket barrier layer 16 has been patterned to form a patterned barrier layer 16a while employing the patterned redistribution layer 20 as an etch mask layer.

Within the preferred embodiment of the present invention, the patterned redistribution layer 20 is preferably formed employing a plating method to economically form the patterned redistribution layer with enhanced properties. Similarly, within the preferred embodiment of the present invention the patterned redistribution layer 20 formed employing the plating method is formed of a copper or copper alloy conductor material, although other conductor materials, including but not limited to nickel, nickel alloy, precious metal and precious metal alloy conductor materials may also be employed (in conjunction with copper, or in the alternative of copper) when forming the patterned redistribution layer 20. Typically and preferably, the patterned redistribution layer 20 is formed to a thickness of from about 1 to about 5 microns angstroms, more preferably from about 1 to about 4 microns and most preferably from about 1 to about 3 microns, while preferably employing the plating method.

When employing the preferred plating method for forming the patterned redistribution layer 20 when formed of a copper conductor material, the plating method also employs: (1) a copper II sulfate aqueous concentration of from about 9.0 to about 11.0 ounces per gallon; (2) a comparatively low pH; (3) a room temperature plating temperature; and (4) a plating current density of from about 20 to about 30 amps per square foot.

With respect to stripping from themicroelectronic fabrication whose schematic cross-sectional diagram is illustrated in FIG. 1 the pair of patterned first photoresist layers 18a and 18b to provide in part from the microelectronic fabrication whose schematic cross-sectional diagram is illustrated in FIG. 1 the microelectronic fabrication whose schematic cross-sectional diagram is illustrated in FIG. 2, the pair of patterned first photoresist layers 18a and 18b may be stripped from the microelectronic fabrication whose schematic cross-sectional diagram is illustrated in FIG. 1 to provide in part the microelectronic fabrication whose schematic cross-sectional diagram is illustrated in FIG. 2 while employing photoresist stripping methods as are conventional in the art of microelectronic fabrication. Such photoresist stripping methods may be selected from the group including but not limited to wet chemical photoresist stripping methods, dry plasma photoresist stripping methods and combinations of wet chemical photoresist stripping methods and dry plasma photoresist stripping methods.

Finally, within the preferred embodiment of the present invention with respect to forming from the blanket barrier layer 16 (and the blanket seed layer formed thereupon) the corresponding patterned barrier layer 16a (and the corresponding patterned seed layer formed thereupon) while employing the patterned redistribution layer 20 as an etch mask layer, such patterning may be accomplished employing wet chemical etch methods or dry plasma etch methods as are otherwise generally conventional in the art of microelectronic fabrication, although with either wet chemical etch methods or dry plasma etch methods there will be generally be lost a minimal and negligible thickness of the patterned redistribution layer 20 when formed of a copper or copper alloy conductor material when etching the blanket seed layer when also formed of a copper or copper alloy conductor material.

Within the preferred embodiment of the present invention, the blanket seed layer when formed of a copper or copper alloy seed material is typically and preferably etched to form the patterned seed layer while employing a proprietary acidic etchant. Similarly, within the preferred embodiment of the present invention, the blanket barrier layer 16 when formed of a titanium layer is etched to form the patterned barrier layer 16a while employing an aqueous ethylene glycol and hydrofluoric acid etchant solution (13.5. liters ethylene glycol:2.4 liters hydrofluoric acid:4 gallons deionized water), or when formed of a titanium-tungsten alloy/titanium-tungsten alloy nitride/titanium-tungsten alloy laminate is preferably etched to form the patterned barrier layer 16a while employing an aqueous 30 percent hydrogen peroxide etchant solution at a temperature of about 70 degrees centigrade.

Shown also within the schematic cross-sectional diagram of FIG. 2 formed upon or over the pair of patterned first planarizing dielectric layers 15a and 15b, the patterned barrier layer 16a (having the patterned seed layer formed thereupon), and the patterned redistribution layer 20 is a blanket second planarizing dielectric layer 22 in turn having formed thereupon a pair of patterned second photoresist layers 24a and 24b.

Within the preferred embodiment of the present invention, the blanket second planarizing dielectric layer 22 is typically and preferably formed employing methods and materials analogous or equivalent to the methods and materials employed for forming the pair of patterned first planarizing dielectric layers 15a and 15b. Typically and preferably, the blanket second planarizing dielectric layer 22 is formed to a thickness of from about 3 to about 6 microns. Similarly, within the preferred embodiment of the present invention, the pair of patterned second photoresist layers 24a and 24b is typically and preferably formed employing methods and materials, although not necessarily dimensions, analogous or equivalent to the methods, materials and dimensions employed for forming the pair of patterned first photoresist layers 18a and 18b as illustrated within the schematic cross-sectional diagram of FIG. 1. Typically and preferably, the pair of patterned second photoresist layers 24a and 24b is formed to a thickness of from about 10 to about 20 microns angstroms to define a bidirectional second aperture of second aperture width from about 30 to about 300 microns, exposing a portion of the blanket second planarizing dielectric layer 22, Referring now to FIG. 3, there is shown a schematic cross-sectional diagram illustrating the results of further processing of the microelectronic fabrication whose schematic cross-sectional diagram is illustrated in FIG. 2.

Figure 3:
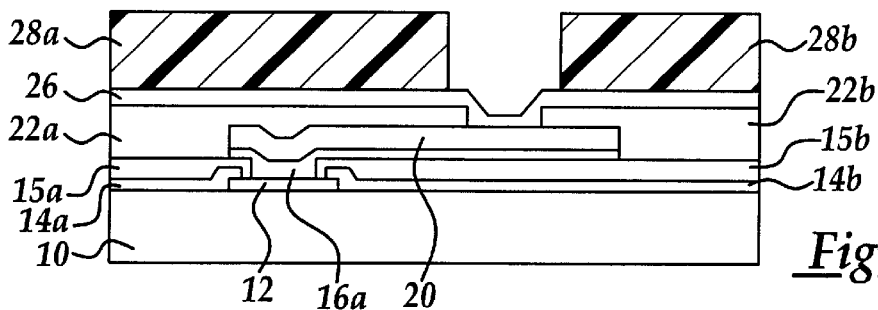

Shown in FIG. 3 is a schematic cross-sectional diagram of a microelectronic fabrication otherwise equivalent to the microelectronic fabrication whose schematic cross-sectional diagram is illustrated in FIG. 2, but wherein: (1) the blanket second planarizing dielectric layer 22 has been patterned to form a pair of patterned second planarizing dielectric layers 22a and 22b while employing the pair of patterned second photoresist layers 24a and 24b as an etch mask layer to expose a portion of the patterned redistribution layer 20; (2) the pair of patterned second photoresist layers 24a and 24b has been stripped from the pair of patterned second planarizing dielectric layers 22a and 22b; (3) there is then formed upon and covering the pair of patterned second planarizing dielectric layers 22a and 22b and exposed portions of the patterned redistribution layer 20 a blanket second barrier layer 26; and (4) there is formed upon the blanket second barrier layer 26 a pair of patterned third photoresist layers 28a and 28b which defines a third aperture which leaves exposed a portion of the blanket second barrier layer 26.

Within the preferred embodiment of the present invention with respect to forming from the blanket second planarizing dielectric layer 22 the pair of patterned second planarizing dielectric layers 22a and 22b while employing the pair of patterned second photoresist layers 24a and 24b as an etch mask layer, the blanket second planarizing dielectric layer 22 may be patterned to form the pair of patterned second planarizing dielectric layers 22a and 22b while employing the pair of patterned second photoresist layers 24a and 24b as an etch mask layer while further employing methods and materials as are conventional in the art of microelectronic fabrication, such methods and materials typically and preferably including dry plasma etching methods and materials, although wet chemical etching methods may also be employed.

Similarly, within the preferred embodiment of the present invention with respect to stripping from the microelectronic fabrication whose schematic cross-sectional diagram is illustrated in FIG. 2 the pair of patterned second photoresist layers 24a and 24b to provide in part the microelectronic fabrication whose schematic cross-sectional diagram is illustrated in FIG. 3, the pair of patterned second photoresist layers 24a and 24b may be stripped from the microelectronic fabrication whose schematic cross-sectional diagram 2 to provide in part the microelectronic fabrication whose schematic cross-sectional diagram is illustrated in FIG. 3 while employing photoresist stripping methods and materials analogous or equivalent to the photoresist stripping methods and materials employed for stripping from the microelectronic fabrication whose schematic cross-sectional diagram is illustrated in FIG. 1 the pair of patterned first photoresist layers 18a and 18b to provide in part the microelectronic fabrication whose schematic cross-sectional diagram is illustrated in FIG. 2.

Similarly, within the preferred embodiment of the present invention with respect to forming the blanket second barrier layer 26 as illustrated within the schematic cross-sectional diagram of FIG. 3, the blanket second barrier layer 26 may be formed employing methods and materials and thickness analogous or equivalent to the methods, materials and thicknesses as are employed for forming the blanket first barrier layer 16 as illustrated within the schematic cross-sectional diagram of FIG. 1.

Finally, within the preferred embodiment of the present invention with respect to forming the pair of patterned third photoresist layers 28a and 28b as illustrated within the schematic cross-sectional diagram of FIG. 3, the pair of patterned third photoresist layers 28a and 28b may be formed employing methods and materials analogous or equivalent to the methods and materials employed for forming the pair of patterned second photoresist layers 24a and 24b as illustrated within the schematic cross-sectional diagram of FIG. 2 or the pair of patterned first photoresist layers 18a and 18b as illustrated within the schematic cross-sectional diagram of FIG. 1. Somewhat in contrast, however, the pair of patterned third photoresist layers 28a and 28b is generally formed to a somewhat thicker thickness of from about 55 to about 65 microns. Typically and preferably, the pair of patterned third photoresist layers 28a and 28b defines the third aperture of bidirectional third aperture width of from about 50 to about 330 microns.

Figure 4:
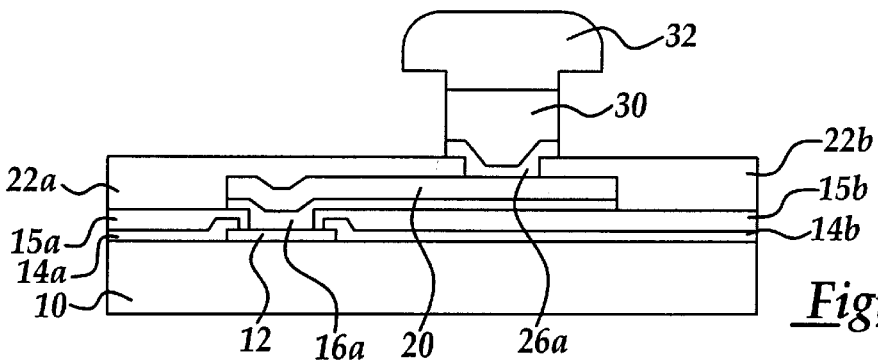

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein there is formed upon the blanket second barrier layer 26 a patterned terminal electrode layer 30; (2) there is formed upon the patterned terminal electrode layer 30 a patterned solder layer 32; (3) the pair of patterned third photoresist layers 28a and 28b is stripped from the microelectronic fabrication; and (4) the blanket second barrier layer 26 is patterned to form a patterned second barrier layer 26a.

Within the preferred embodiment of the present invention, the patterned terminal electrode layer 30 may be formed employing plating methods and materials analogous or equivalent to the plating methods and materials employed for forming the patterned redistribution layer 20. Thus, the patterned terminal electrode layer is typically and preferably formed at least in part of a copper or copper alloy conductor material, typically and preferably formed to a thickness of from about 7 to about 70 microns, more preferably from about 15 to about 70 microns and most preferably from about 54 to about 66 microns angstroms. However, the patterned terminal electrode layer 30 may also comprise in addition to a layer formed of a copper or copper alloy conductor material, additional layers formed thereupon, such as for example and without limitation: (1) a nickel or nickel alloy conductor material layer formed to a thickness of from about 5000 to about 15000 angstroms formed upon the copper or copper alloy conductor material layer; and (2) a gold or gold alloy conductor material layer of thickness from about 4000 to about 12000 angstroms formed upon the nickel or nickel alloy conductor material layer. Such nickel, nickel alloy, copper or copper alloy conductor materials may also typically and preferably be formed employing a plating method, although under certain circumstances other deposition methods may also be employed.

Similarly, within the preferred embodiment of the present invention with respect to the patterned solder layer 32 as illustrated within the schematic cross-sectional diagram of FIG. 4, although the patterned solder layer 32 as illustrated within the schematic cross-sectional diagram of FIG. 4 is illustrated as formed employing a plating method, the patterned solder layer 32 may alternatively be formed employing any of several methods, including but not limited to plating methods, screen printing methods and solder preform pick and place methods. Typically and preferably, the patterned solder layer 32 is formed to a thickness of from about 60 to about 180 microns while employing a lead-tin alloy solder material having a lead:tin weight ratio or from about 37:63 to about 95:5.

Still similarly, within the preferred embodiment of the present invention with respect to stripping from the microelectronic fabrication whose schematic cross-sectional diagram is illustrated in FIG. 3 the pair of patterned third photoresist layers 24a and 24b to provide in part the pair of microelectronic fabrication whose schematic cross-sectional diagram illustrated in FIG. 4, the pair of patterned third photoresist layers 24a and 24b may be stripped from the microelectronic fabrication whose schematic cross-sectional diagram is illustrated in FIG. 3 to provide in part the microelectronic fabrication whose schematic cross-sectional diagram is illustrated in FIG. 4 while employing photoresist stripping methods and materials analogous or equivalent to the photoresist stripping methods and materials employed for: (1) stripping the pair of patterned second photoresist layers 24a and 24b from the microelectronic fabrication whose schematic cross-sectional diagram is illustrated in FIG. 2 to provide in part the microelectronic fabrication whose schematic cross-sectional diagram is illustrated in FIG. 3; or (2) stripping the pair of patterned first photoresist layers 18a and 18b from the microelectronic fabrication whose schematic cross-sectional diagram is illustrated in FIG. 1 to provide in part the microelectronic fabrication whose schematic cross-sectional diagram is illustrated in FIG. 2.

Finally, within the preferred embodiment of the present invention, with respect to forming from the blanket second barrier layer 26 (and a corresponding blanket second seed layer formed thereupon) the patterned barrier layer 26a (and a corresponding patterned second seed layer formed thereupon), the blanket second barrier layer 26 (and the blanket second seed layer) may be patterned to form the patterned second seed layer 26a (and the patterned second seed layer) while employing patterning methods analogous or equivalent to the patterning methods employed for forming from the blanket first barrier layer 16 (and blanket first seed layer formed thereupon) as illustrated within the schematic cross-sectional diagram of FIG. 1 the patterned first barrier layer 16a (and patterned first seed layer formed thereupon) as illustrated within the schematic cross-sectional diagram of FIG. 2.

Figure 5:
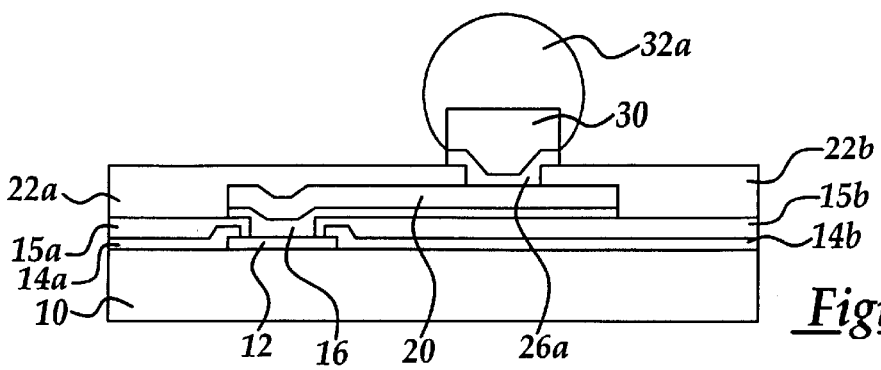

Referring now to FIG. 5, there is shown a schematic cross-sectional diagram illustrating the results of further processing of the microelectronic fabrication whose schematic cross-sectional diagram is illustrated in FIG. 4. Shown in FIG. 5 is a schematic cross-sectional diagram of a microelectronic fabrication otherwise equivalent to the microelectronic fabrication whose schematic cross-sectional diagram is illustrated in FIG. 4, but wherein the patterned solder layer 32 has been reflowed to form a reflowed patterned solder layer 32a.

Within the preferred embodiment of the present invention, the patterned solder layer 32 as illustrated within the schematic cross-sectional diagram of FIG. 4 may be reflowed to form the reflowed patterned solder layer 32a as illustrated within the schematic cross-sectional diagram of FIG. 5 while employing thermal reflow methods as are conventional in the art of microelectronic fabrication. Such thermal reflow methods typically and preferably employ a nitrogen atmosphere, at a temperature of from about 220 to about 240 degrees centigrade for a time period of from about 1.5 to about 2.0 minutes when employing lower melting point solder materials, to both form the reflowed patterned solder layer 32a and provide more optimal metallurgical properties, such as hardness properties to other metal layers, and in particular electroplated metal layers, within the microelectronic fabrication whose schematic cross-sectional diagram is illustrated in FIG. 5.

Upon forming the microelectronic fabrication whose schematic cross-sectional diagram is illustrated in FIG. 5, there is formed a microelectronic fabrication having formed therein a terminal electrode structure and a redistribution structure which are economically fabricated with optimal properties. The present invention realizes the foregoing objects by employing when forming the terminal electrode structure, and in particular the redistribution structure, a plating method.

As is understood by a person skilled in the art, the preferred embodiment of the present invention is illustrative of the present invention rather than limiting of the present invention. Revisions and modifications may be made to methods, materials, structures and dimensions through which may be provided within a microelectronic fabrication a terminal electrode structure and a redistribution structure in accord with the preferred embodiment of the present invention, while still providing a terminal electrode structure and a redistribution structure within a microelectronic fabrication in accord with the present invention, further in accord with the appended claims.

What is claimed is:

1. A method for fabricating a microelectronic fabrication comprising:

providing a substrate;

forming over the substrate a patterned bond pad layer;

forming over the substrate and in electrical communication with the patterned bond pad layer a first barrier layer; and forming over the first barrier layer on top of the patterned bond pad layer a patterned redistribution layer;

forming over the patterned redistribution layer a second barrier layer;

forming over the second barrier layer and in electrical communication with the patterned redistribution layer a patterned terminal electrode layer, wherein at least one of the first barrier layer and the second barrier layer is formed of tri-layer stack comprising:

a first titanium-tungsten alloy layer;

a titanium-tungsten alloy nitride layer formed upon the first titanium-tungsten alloy layer; and a second titanium-tungsten alloy layer formed upon the titanium-tungsten alloy nitride layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the patterned bond pad layer is formed from a bond pad material selected from the group consisting of aluminum, aluminum alloys, copper and copper alloys.

4. The method of claim 1 wherein the patterned redistribution layer is formed from a conductor material selected from the group consisting of copper, copper alloy, nickel, nickel alloy, precious metal and precious metal alloy conductor materials.

5. The method of claim 1 further comprising forming in electrical communication with the patterned redistribution layer a patterned terminal electrode layer, wherein the patterned terminal electrode layer is also formed employing a plating method.

6. The method of claim 5 further comprising forming upon the patterned terminal electrode layer a patterned solder layer.

7. The method of claim 1 wherein the patterned terminal electrode layer is formed from at least one conductor material selected from the group consisting of copper, copper alloy, nickel, nickel alloy, precious metal and precious metal alloy conductor materials.

8. The method of claim 1 wherein both of the first barrier layer and the second barrier layer are formed of a tri-layer stack comprising:

a first titanium-tungsten alloy layer;

a titanium-tungsten alloy nitride layer formed upon the first titanium-tungsten alloy layer; and a second titanium-tungsten alloy layer formed upon the titanium-tungsten alloy nitride layer.

9. The method of claim 1 wherein:

at least one of the first barrier layer and the second barrier layer is formed of a barrier material selected from the group consisting of titanium barrier materials and tungsten barrier materials; and the at least one of the first barrier layer and the second barrier layer has formed thereupon a copper seed layer.

10. A microelectronic fabrication comprising:

a substrate;

a patterned bond pad layer formed over the substrate;

a patterned redistribution layer formed over the substrate and in electrical communication with the patterned bond pad layer;

a patterned terminal electrode layer formed over the substrate and in electrical communication with the patterned redistribution layer;

at least one of:

a first barrier layer interposed between the patterned bond pad layer and the patterned redistribution layer;

a second barrier layer interposed between the patterned terminal electrode layer and the patterned redistribution layer;

wherein the at least one of the first barrier layer and the second barrier layer is formed of a tri-layer stack comprising:

a first titanium-tungsten alloy layer;

a titanium-tungsten alloy nitride layer formed upon the first titanium-tungsten alloy layer; and a second titanium-tungsten alloy layer formed upon the titanium-tungsten alloy nitride layer.

11. The microelectronic fabrication of claim 10 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

12. The microelectronic fabrication of claim 10 wherein the patterned bond pad layer is formed from a bond pad material selected from the group consisting of aluminum, aluminum alloys, copper and copper alloys.

13. The microelectronic fabrication of claim 10 wherein the patterned redistribution layer is formed from a conductor material selected from the group consisting of copper, copper alloy, nickel, nickel alloy, precious metal and precious metal alloy conductor materials.

14. The microelectronic fabrication of claim 10 wherein the patterned terminal electrode layer is formed from at least one conductor material selected from the group consisting of copper, copper alloy, nickel, nickel alloy, precious metal and precious metal alloy conductor materials.

15. The microelectronic fabrication of claim 10 further comprising a patterned solder layer formed upon the patterned terminal electrode layer.

* * * * *